(12) United States Patent
Gu

(10) Patent No.: US 12,385,601 B2
(45) Date of Patent: *Aug. 12, 2025

(54) SIMPLE STRUCTURE ELECTRIC OIL PUMP WITH ONE-WAY AIR VALVE

(71) Applicant: Zhongshan Jitonglong Plastic Hardware Products Co., Ltd., Zhongshan (CN)

(72) Inventor: Xinguo Gu, Zhongshan (CN)

(73) Assignee: Zhongshan Jitonglong Plastic Hardware Products Co., Ltd., Zhongshan (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/969,188

(22) Filed: Dec. 4, 2024

(65) Prior Publication Data

US 2025/0092990 A1   Mar. 20, 2025

(30) Foreign Application Priority Data

Oct. 29, 2024  (CN) .......................... 202422620677.7

(51) Int. Cl.
| | |
|---|---|
| *F04D 13/06* | (2006.01) |
| *F16N 13/22* | (2006.01) |
| *H05K 5/02* | (2006.01) |

(52) U.S. Cl.
CPC ........... *F16N 13/22* (2013.01); *H05K 5/0213* (2013.01); *F04D 13/0686* (2013.01)

(58) Field of Classification Search
CPC ... F16N 13/22; H05K 5/0213; F04D 13/0686; F04D 13/08; F04D 13/086; F04D 29/08; F04D 29/086; F04D 15/0083
USPC ......................................................... 454/184
See application file for complete search history.

(56) References Cited

U.S. PATENT DOCUMENTS

| | | | |
|---|---|---|---|
| 11,686,297 B1 * | 6/2023 | Gu ........................ | F04B 49/065 |
| | | | 417/36 |
| 2012/0112581 A1 * | 5/2012 | Maekawa .............. | H02K 11/25 |
| | | | 310/71 |

* cited by examiner

*Primary Examiner* — Avinash A Savani
*Assistant Examiner* — Ryan L Faulkner

(57) ABSTRACT

A simple structure electric oil pump with an one-way air valve is provided, which includes a control box and an electromagnetic exhaust valve. The control box is provided with a connecting pipe and a control board. One end of the connecting pipe is connected to an oil extraction pipe, and the other end is connected to an oil outlet pipe. The control box is equipped with an intake port and an intake duct. The electromagnetic exhaust valve is equipped with an exhaust tube and an intake tube. The exhaust tube is installed inside the intake port. When the stop button is pressed, the electromagnetic force disappears, and the exhaust tube and the intake tube are in a ventilated status, allowing the connecting pipe to be connected to the outside for exhaust, and external air is discharged into the connecting pipe to destroy the siphon effect of the pipeline.

7 Claims, 3 Drawing Sheets

SIMPLE STRUCTURE ELECTRIC OIL PUMP WITH ONE-WAY AIR VALVE

CROSS-REFERENCE

This application claims to the benefit of priority from Chinese Application No. 202422620677.7 with a filing date of Oct. 29, 2024. The content of the aforementioned applications, including any intervening amendments thereto, are incorporated herein by reference.

TECHNICAL FIELD

The disclosure relates to a pump, in particular to an oil pump.

BACKGROUND

The patent document with the publication number CN218620333U discloses an electric oil extraction pump with an one-way valve. The technical solution adopted is: a control box is provided with a connecting pipe and a control board, one end of the connecting pipe is connected to the oil extraction pipe, and the other end is connected to the oil outlet pipe. The control box is equipped with an intake port that is connected to the connecting pipe and an intake pipe that communicates with the bottom of the control box. The outer side of the intake port is provided with a valve body, and the upper end of the valve body is equipped with an intake chamber and the lower end is equipped with an exhaust chamber. There is a connecting channel between the intake chamber and the exhaust chamber, and a movable sealing ball is installed in the exhaust chamber for blocking the opening of the connecting channel. During the operation of this oil pump, liquid enters the exhaust chamber and pushes the sealing ball upward until the connecting channel is blocked, preventing liquid from flowing out of the valve body. However, this type of oil pump has a complex structure, and the sealing ball is only pushed after the liquid enters the exhaust chamber. In practical applications, a small portion may still overflow into the control box, causing internal damage to the control box.

SUMMARY

In order to overcome the shortcomings of existing technology, this disclosure provides a simple structure electric oil pump with an one-way air valve.

The technical solution adopted by this disclosure to solve the technical problem is:

A simple structure electric oil pump with one-way air valve, including a control box, wherein a connecting pipe and a control board are provided on the control box, one end of the connecting pipe is connected to an oil extraction pipe, and the other end of the connecting pipe is connected to an oil outlet pipe; a pump body electrically connected to the control board is arranged inside the oil extraction pipe, and a screw cover is rotatably arranged at the bottom of the control box; the control box is provided with an intake port in communication to the connecting pipe and an intake duct penetrating the bottom of the control box; the control box is provided with an electromagnetic exhaust valve electrically connected to the control board; the electromagnetic exhaust valve is provided with an exhaust tube and an intake tube connected to an inner cavity; after assembly, the exhaust tube is located inside the intake port, and a liquid storage box is arranged at an opening of the intake tube.

A liquid storage chamber is provided inside the liquid storage box, and a through hole in communication to the liquid storage chamber is provided on the lower side of the liquid storage box; after assembly, the intake tube is inserted into the through hole.

A box cover is installed on the top of the liquid storage box, and a ventilation hole in communication to the liquid storage chamber is provided on the box cover.

The electromagnetic exhaust valve includes a valve seat, the exhaust tube is located at one end of the valve seat, the intake tube is located at the other end of the valve seat, and the axis of the exhaust tube is perpendicular to the axis of the intake tube.

The control box is provided with a battery chamber electrically connected to the control board.

A plug is provided at a bottom of the battery chamber; after assembly, the plug is inserted into the intake duct.

A sealing ring is installed between the plug and the intake duct.

The bottom of the control box is provided with an intake chamber with one end open along the width direction, and the inner wall of the intake chamber is provided with a communication hole in communication to the intake duct.

The advantageous effects of this disclosure are:

(1) The present disclosure installs an electromagnetic exhaust valve with an one-way air valve on the intake port of the control box. The electromagnetic exhaust valve is equipped with an exhaust tube and an intake tube connected to the inner cavity. The exhaust tube is installed inside the intake port, and a liquid storage box is installed at the opening of the intake tube. When the power button is pressed, the electromagnetic force of the electromagnetic exhaust valve closes the valve, thereby sealing the intake port and preventing liquid from overflowing. At this time, the pump body can pump and transport liquid normally. When the stop button is pressed, the electromagnetic force disappears, and the exhaust tube and the intake tube are in a ventilated status, allowing the connecting pipe to be connected to the outside for exhaust, at this time, external air is discharged into the connecting pipe to destroy the siphon effect of the pipeline. This not only removes the remaining liquid, but also effectively prevents liquid reflux, ensuring the safety and normal function of the system.

(2) This present disclosure adopts an electrically controlled electromagnetic exhaust valve. Compared with the prior art, this application only requires one electromagnetic exhaust valve to achieve the function of an one-way air valve, which is not only simple in structure and easy to assemble, but also can block the intake port at the moment of oil pumping start-up, further preventing liquid overflow.

BRIEF DESCRIPTION OF THE DRAWINGS

The following will further illustrate the present disclosure in conjunction with the accompanying drawings and embodiments.

DETAILED DESCRIPTION OF THE EMBODIMENTS

In order to make the objective, technical solution, and advantages of the present disclosure clearer and more understandable, the following will provide a further detailed illustration of the present disclosure in conjunction with specific implementation methods and with reference to the accompanying drawings. It should be noted that the embodiments and features of the present disclosure can be combined with each other without conflict.

It should be understood that these descriptions are only illustrative and not intended to limit the scope of the present disclosure.

Below, some embodiments of the present disclosure are described in conjunction with the accompanying drawings.

Figure 1:
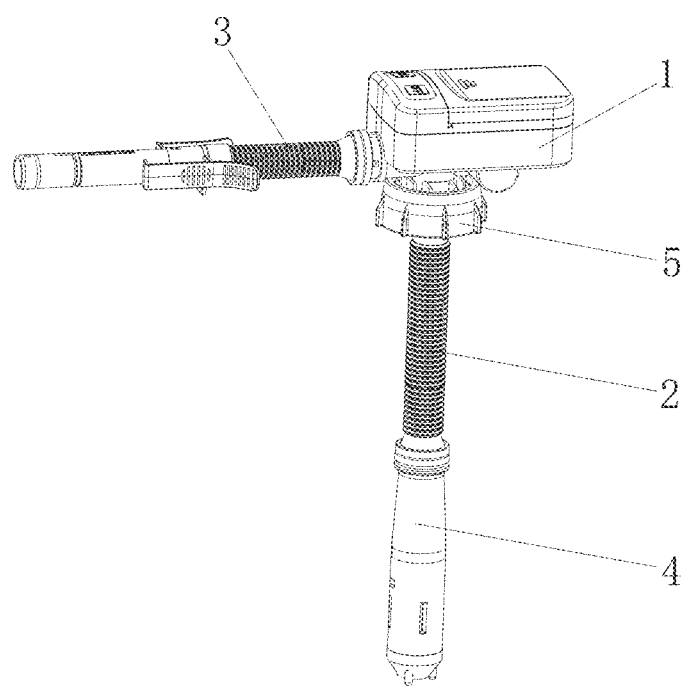
FIG. 1 is a schematic diagram of the structure of the present disclosure.
Figure 2:
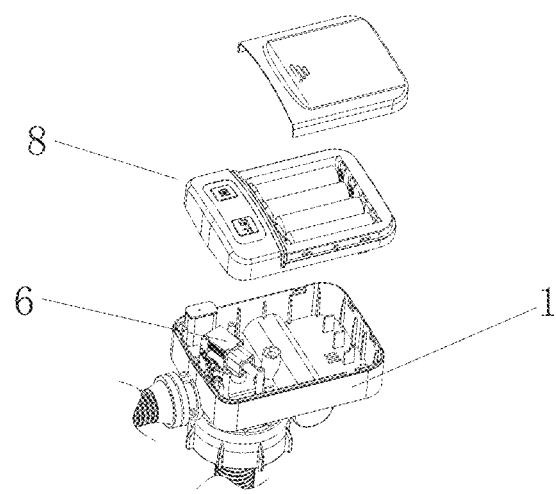
FIG. 2 is an exploded view of the structure of the present disclosure.
Figure 3:
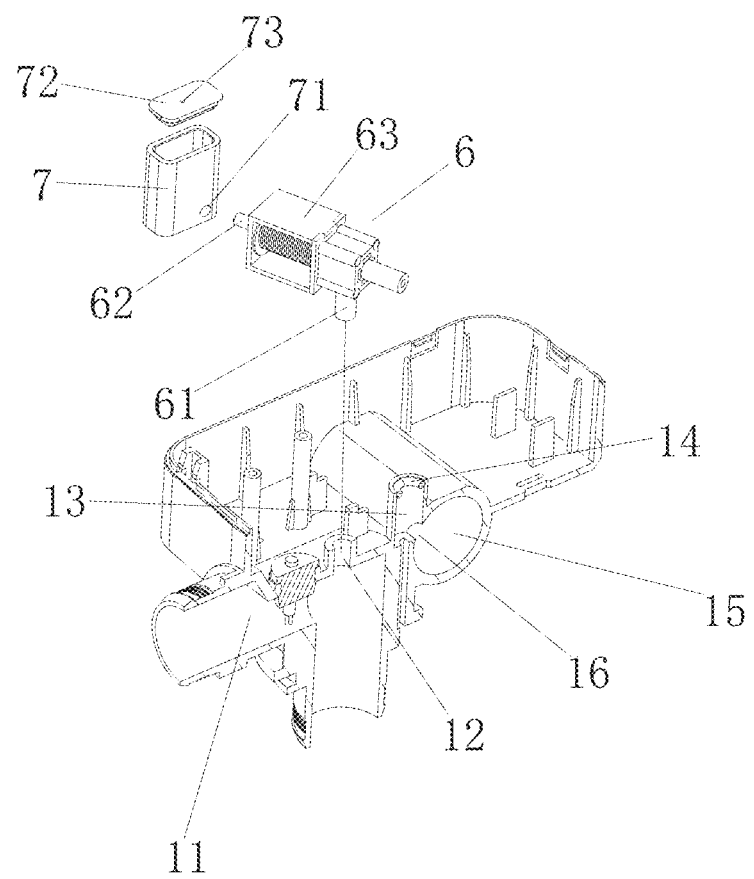
FIG. 3 is a partially exploded view of the structure of the present disclosure.

As shown in FIG. 1 to FIG. 3, a simple structure electric oil pump with one-way air valve is provided, which includes a control box 1, wherein a connecting pipe 11 and a control board are provided on the control box 1, and one end of the connecting pipe 11 is connected to an oil extraction pipe 2, and the other end of the connecting pipe 11 is connected to an oil outlet pipe 3. A pump body 4 electrically connected to the control board is arranged inside the oil extraction pipe 2, and a screw cover 5 is rotatably arranged at the bottom of the control box 1. The control box 1 is provided with an intake port 12 in communication to the connecting pipe 11 and an intake duct 13 penetrating the bottom of the control box 1. The control box 1 is provided with an electromagnetic exhaust valve 6 electrically connected to the control board, and the electromagnetic exhaust valve 6 is provided with an exhaust tube 61 and an intake tube 62 connected to an inner cavity. After assembly, the exhaust tube 61 is located inside the intake port 12, and a liquid storage box 7 is arranged at an opening of the intake tube 62. This present disclosure adopts an electrically controlled electromagnetic exhaust valve 6. Compared with the prior art, this application only requires one electromagnetic exhaust valve to achieve the function of an one-way air valve, which is not only simple in structure and easy to assemble, but also can block the intake port at the moment of oil pumping start-up, further preventing liquid overflow.

The present disclosure installs an electromagnetic exhaust valve 6 on the intake port 12 of the control box 1 as an one-way air valve, wherein the electromagnetic exhaust valve 6 includes a valve seat 63, the exhaust tube 61 is located at one end of the valve seat 63, the intake tube 62 is located at the other end of the valve seat 63, and the axis of the exhaust tube 61 is perpendicular to the axis of the intake tube 62. In this embodiment, the electromagnetic exhaust valve 6 can be a commercially available air valve, air pump, or electromagnetic valve. The valve seat 63 is equipped with coils, and the inner cavity of the electromagnetic exhaust valve 6 is equipped with a valve core. The coils are energized to generate electromagnetic force to control the opening or closing of the valve.

Specifically, when the power button is pressed, the electromagnetic force of the electromagnetic exhaust valve 6 closes the valve, thereby sealing the intake port 12 and preventing liquid from overflowing. At this time, the pump body can pump and transport liquid normally. When the stop button is pressed, the electromagnetic force disappears, the valve core springs open under the action of its own spring structure, and the exhaust tube 61 and the intake tube 62 are in a ventilated status, allowing the connecting pipe 11 to be connected to the outside for exhaust, at this time, external air is discharged into the connecting pipe 11 to destroy the siphon effect of the pipeline. This not only removes the remaining liquid, but also effectively prevents liquid reflux, ensuring the safety and normal function of the system.

A liquid storage chamber is provided inside the liquid storage box 7, and a through hole 71 in communication to the liquid storage chamber is provided on the lower side of the liquid storage box 7. After assembly, the intake tube 62 is inserted into the through hole 71. A box cover 72 is installed on the top of the liquid storage box 7, and a ventilation hole 73 in communication to the liquid storage chamber is provided on the box cover 72. When the power is cut off, the pump body stops working, and there is residual liquid in the connecting pipeline 11, which flows back to the oil extraction pipe. At this time, the exhaust tube 61 and the intake tube 62 are in a ventilated status, and some portion of the liquid will flow into the intake port 12, then stored in the liquid storage box 7, and then flow back to the oil extraction pipe through the electromagnetic exhaust valve channel to further prevent liquid overflow.

The control box 1 is provided with a battery chamber 8 electrically connected to the control board. Lithium batteries can be installed inside the battery chamber, with low voltage direct current, simple and safe to use, and easy to replace.

A plug is provided at the bottom of the battery chamber 8, after assembly, the plug is inserted into the intake duct 13, and a sealing ring 14 is installed between the plug and the intake duct 13, which can effectively prevent liquid from flowing into the control box.

The bottom of the control box 1 is provided with an intake chamber 15 with one end open along the width direction, and the inner wall of the intake chamber 15 is provided with a communication hole 16 in communication to the intake duct 13. During the pumping process, the air pressure inside the oil drum is connected to the external air pressure to maintain pressure balance inside and outside the oil drum, thereby avoiding deformation of the oil drum during the pumping process.

Although the embodiments of the present disclosure have been shown and described, those skilled in the art can understand that various changes, modifications, substitutions, and variations can be made to these embodiments without departing from the principles and purposes of the present disclosure. The scope of the present disclosure is limited by the claims and their equivalents.

What is claimed is:

1. A simple structure electric oil pump with one-way air valve, comprising a control box, wherein a connecting pipe and a control board are provided on the control box, one end of the connecting pipe is connected to an oil extraction pipe, and the other end of the connecting pipe is connected to an oil outlet pipe; a pump body electrically connected to the control board is arranged inside the oil extraction pipe, and a screw cover is rotatably arranged at a bottom of the control box, characterized in that the control box is provided with an intake port in communication to the connecting pipe and an intake duct penetrating the bottom of the control box; the control box is provided with an electromagnetic exhaust valve electrically connected to the control board; the electromagnetic exhaust valve is provided with an exhaust tube and an intake tube connected to an inner cavity; after assembly, the exhaust tube is located inside the intake port, and a liquid storage box is arranged at an opening of the intake tube;

a liquid storage chamber is provided inside the liquid storage box, and a through hole in communication to the liquid storage chamber is provided on a lower side of the liquid storage box; after assembly, the intake tube is configured to be inserted into the through hole.

2. The simple structure electric oil pump with one-way air valve according to claim 1, wherein a box cover is installed on a top of the liquid storage box, and a ventilation hole in communication to the liquid storage chamber is provided on the box cover.

3. The simple structure electric oil pump with one-way air valve according to claim 1, wherein the electromagnetic exhaust valve comprises a valve seat, the exhaust tube is located at one end of the valve seat, the intake tube is located at the other end of the valve seat, and an axis of the exhaust tube is perpendicular to an axis of the intake tube.

4. The simple structure electric oil pump with one-way air valve according to claim 1, wherein the control box is provided with a battery chamber electrically connected to the control board.

5. The simple structure electric oil pump with one-way air valve according to claim 4, wherein a plug is provided at a bottom of the battery chamber; after assembly, the plug is inserted into the intake duct.

6. The simple structure electric oil pump with one-way air valve according to claim 5, wherein a sealing ring is installed between the plug and the intake duct.

7. The simple structure electric oil pump with one-way air valve according to claim 1, wherein the bottom of the control box is provided with an intake chamber with one end open along a width direction, and an inner wall of the intake chamber is provided with a communication hole in communication to the intake duct.

\* \* \* \* \*